(12) United States Patent
Heringa et al.

(10) Patent No.: US 9,142,625 B2
(45) Date of Patent: Sep. 22, 2015

(54) FIELD PLATE ASSISTED RESISTANCE REDUCTION IN A SEMICONDUCTOR DEVICE

(71) Applicant: NXP B.V., Eindhoven (NL)

(72) Inventors: Anco Heringa, Eindhoven (NL); Gerhard Koops, Aalst (BE); Boni Kofi Boksteen, Enschede (NL); Alessandro Ferrara, Eindhoven (NL)

(73) Assignee: NXP B.V., Eindhoven (NL)

( * ) Notice: Subject to any disclaimer, the term of this patent is extended or adjusted under 35 U.S.C. 154(b) by 164 days.

(21) Appl. No.: 13/651,096

(22) Filed: Oct. 12, 2012

(65) Prior Publication Data

US 2014/0103968 A1  Apr. 17, 2014

(51) Int. Cl.
*H01L 21/02* (2006.01)
*H01L 29/40* (2006.01)
*H01L 29/78* (2006.01)
*H01L 29/786* (2006.01)

(52) U.S. Cl.
CPC ............ *H01L 29/402* (2013.01); *H01L 29/404* (2013.01); *H01L 29/7835* (2013.01); *H01L 29/78624* (2013.01)

(58) Field of Classification Search
CPC .. H01L 29/402; H01L 29/404; H01L 29/7833
USPC ............................ 257/344, E29.266; 438/163
See application file for complete search history.

(56) References Cited

U.S. PATENT DOCUMENTS

| 4,290,077 | A | * | 9/1981 | Ronen ........................... 257/409 |
| 5,055,896 | A | * | 10/1991 | Williams et al. .............. 257/409 |
| 5,237,193 | A | | 8/1993 | Williams et al. |
| 2003/0218211 | A1 | | 11/2003 | John et al. |
| 2012/0175679 | A1 | | 7/2012 | Marino et al. |

OTHER PUBLICATIONS

Extended European Search Report for Appln. No. 13185012.5 dated Dec. 16, 2013.

* cited by examiner

*Primary Examiner* — Kenneth Parker
*Assistant Examiner* — John Lin

(57) ABSTRACT

Embodiments of a semiconductor device, a circuit including a semiconductor device and a driver circuit, and a method for operating a semiconductor device are described. In one embodiment, a semiconductor device includes a substrate, a source region, a drain region, and a drain extension region formed in the substrate, and an insulation layer adjacent to the drain extension region. A gate layer and a field plate are formed one of within and on the insulation layer. The field plate is located adjacent to the drain extension region and is electrically insulated from the gate layer and the source region such that a voltage can be applied to the field plate independent from voltages applied to the gate layer and the source region. Other embodiments are also described.

13 Claims, 5 Drawing Sheets

FIELD PLATE ASSISTED RESISTANCE REDUCTION IN A SEMICONDUCTOR DEVICE

BACKGROUND

The footprint of a transistor for a specific circuit is at least partially a function of the output current required by the circuit. A semiconductor device having a relatively low on-resistance can have a relative high output current and, consequently, can have a smaller footprint.

An ideal transistor has zero resistance in the on state and infinite resistance in the off state. However, the on-resistance of a transistor is determined by numerous factors and is generally not zero. Channel resistance and drift region resistance are two most significant factors that contribute to on-resistance. Accordingly, reductions in the channel resistance or the drift region resistance of a semiconductor device can lead to a decrease in the device's on-resistance, which may help to limit the footprint of the device.

SUMMARY

Embodiments of a semiconductor device, a circuit including a semiconductor device and a driver circuit, and a method for operating a semiconductor device are described. In one embodiment, a semiconductor device includes a substrate, a source region, a drain region, and a drain extension region formed in the substrate, and an insulation layer adjacent to the drain extension region. A gate layer and a field plate are formed one of within and on the insulation layer. The field plate is located adjacent to the drain extension region and is electrically insulated from the gate layer and the source region such that a voltage can be applied to the field plate independent from voltages applied to the gate layer and the source region. Because the field plate is electrically insulated from the gate layer and the source region, a voltage can be applied to the field plate without affecting the voltages applied to the gate layer and the source region. Consequently, the on-resistance of the semiconductor device can be lowered and the footprint of the semiconductor device can be reduced. Other embodiments are also described.

In an embodiment, a semiconductor device includes a substrate, a source region, a drain region, and a drain extension region formed in the substrate, and an insulation layer adjacent to the drain extension region. A gate layer and a field plate are formed one of within and on the insulation layer. The field plate is located adjacent to the drain extension region and is electrically insulated from the gate layer and the source region such that a voltage can be applied to the field plate independent from voltages applied to the gate layer and the source region.

In an embodiment, a circuit includes a semiconductor device and a driver circuit. The semiconductor device includes a substrate, a source region, a drain region, and a drain extension region formed in the substrate, and an insulation layer adjacent to the drain extension region. A gate layer and a field plate are formed one of within and on the insulation layer. The field plate is located adjacent to the drain extension region and is electrically insulated from the gate layer and the source region such that a voltage can be applied to the field plate independent from voltages applied to the gate layer and the source region. The driver circuit is configured to provide a first voltage to the gate layer and a second voltage to the field plate.

In an embodiment, a method for operating a semiconductor device includes applying first voltages to a source region and a gate layer of the semiconductor device and applying a second voltage to a field plate of the semiconductor device that is electrically insulated from the gate layer and the source region. Application of the second voltage to the field plate is independent from the first voltages applied to the source region and the gate layer.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
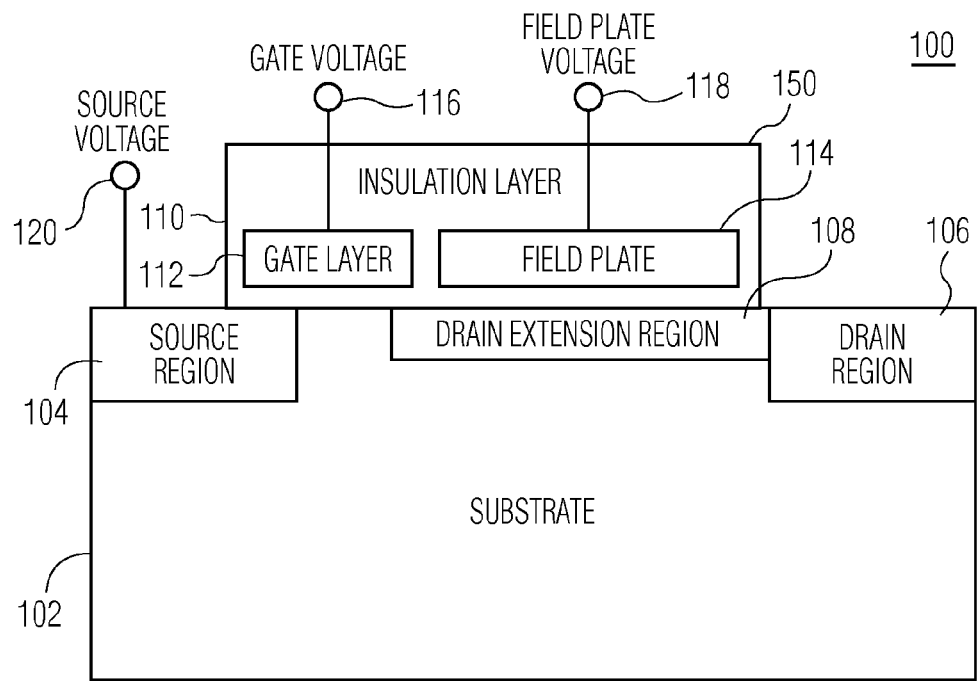
FIG. 1 is a schematic block diagram of a semiconductor device in accordance with an embodiment of the invention.

FIG. 1 is a schematic block diagram of a semiconductor device 100 in accordance with an embodiment of the invention. The semiconductor device may be a lateral device or a vertical device. In an embodiment, the semiconductor device is a semiconductor circuit, such as, a transistor. For example, the semiconductor device 100 may be a silicon on insulator (SOI) based transistor, a fin field effect transistor (FET), or a trench FET. In the embodiment depicted in FIG. 1, the semiconductor device 100 includes a substrate 102, a source region 104, a drain region 106, and a drain extension region 108, which is also referred to as a drain drift region, formed in the substrate 102, and an insulation layer 110 adjacent to the drain extension region. The source region, the drain region, and the drain extension region are formed by conventional semiconductor processing techniques. For example, the source region, the drain region, and the drain extension region can be created in the substrate 102 by properly implanted doping. The insulation layer 110 may be a layer stack that includes multiple sub-layers. In an embodiment, the semiconductor device 100 is part of a semiconductor IC chip that is included in a power device in automobile or lighting, or in a computing device, such as a smartphone, a tablet computer, a laptop, etc. The semiconductor device 100 may include an n-channel metal-oxide-semiconductor (NMOS) device or a p-channel metal-oxide-semiconductor (PMOS) device, which can have inverted doping and voltages compared to an NMOS device. As will be readily apparent to those skilled in the art upon a complete reading of the present application, the semiconductor device 100 can be implemented using a variety of technologies, e.g., NMOS, PMOS, CMOS, etc., and is not limited to a particular type of semiconductor devices.

In the embodiment depicted in FIG. 1, the source region 104, the drain region 106, and the drain extension region 108 are located on the top part of the substrate 102. The insulation layer 110 may be on top of or at the bottom of the substrate 102. In an embodiment, the insulation layer 110 is located on top of the substrate 102 in a vertical direction in that the insulation layer 110 is in direct contact with a top surface of the substrate 102. In another embodiment, an intermediate layer, such as an oxide layer, exists between the insulation layer 110 and the substrate 102. However, the insulation layer 110 is still considered as "on top of" the substrate 102, with respect to the vertical direction as presented in FIG. 1. In one embodiment, the semiconductor device 100 may be a trench FET or a fin FET, in which the insulation layer 110 is located aside the substrate 102.

In the embodiment depicted in FIG. 1, a gate layer 112 and a field plate 114 are formed within or on the insulation layer 110. The gate layer 112 or the field plate 114 may be fully enclosed in the insulation layer 110 or exposed at the top surface 150 of the insulation layer 110. The gate layer 112 is connected to a voltage terminal 116 to receive a gate voltage. The field plate 114 is connected to a voltage terminal 118 to receive a field plate voltage. The source region 104 is connected to a voltage terminal 120 to receive a source voltage.

In the semiconductor device 100, a significant part of its on state resistance is caused by the drain extension region 108. In the on state of the semiconductor device 100, the semiconductor device 100 is switched on and current flows between the source region 104 and the drain region 106. In the embodiment depicted in FIG. 1, the field plate 114 is located adjacent to the drain extension region. In an embodiment, the field plate 114 is located over the drain extension region in a vertical direction. By putting the field plate 114 adjacent to the drain extension region, the Reduced Surface Field (RE-SURF) effect can be used to decrease the resistance associated with the drain extension region. In particular, the field plate 114 is grounded or connected to a negative voltage during the off state of the semiconductor device 100. In the off state of the semiconductor device 100, the semiconductor device 100 is switched off and no current flows between the source region and the drain region. By grounding the field plate 114 during the off state of the semiconductor device 100, the drain extension region can be more easily depleted in the off state and as such high voltages can still be supported by the semiconductor device 100 at higher drain extension doping.

A conventional semiconductor device typically has a one piece gate layer/field plate. Compared to a conventional semiconductor device that has a one piece gate layer/field plate, in the embodiment depicted in FIG. 1, the field plate 114 is electrically insulated from the source region 104 and the gate layer 112. For example, the field plate 114 is electrically separated from the source region and the gate layer 112 by at least a portion of the insulation layer 110. Because the field plate 114 is electrically insulated from the source region and the gate layer 112, a voltage can be applied to the field plate 114 independent from (e.g., without affecting) the voltages applied to the source region and the gate layer 112. In an embodiment, a voltage is applied to the field plate 114 independently from the voltages applied at the source region and the gate layer 112 in that application of the voltage at the field plate 114 does not cause a significant change in the voltages at the source region and the gate layer 112 due to, for example, voltage leaking through the insulation layer 110. In some embodiments, there may be some leakage voltage from the field plate 114 to the gate layer 112 through the insulation layer 110. However, in these embodiments, the voltage may still be considered as being applied to the field plate 114 independently from the voltages applied at the source region and the gate layer 112. Because a voltage can be applied to the field plate 114 independent from the voltages applied to the source region and the gate layer 112, the voltage applied to the field plate 114 can be higher or lower than the voltage applied to the gate layer 112. Consequently, the doping level in the drain extension region 108 can be made higher. The drift resistance of the semiconductor device 100 is determined by the drift doping concentration of the semiconductor device 100. Generally, in order to have a high breakdown voltage, the drift doping concentration of a semiconductor device has to be low. Such a low doping induces a high on state resistance. Because the doping level in the drain extension region 108 can be made higher, the on state resistance of the semiconductor device 100 can be lowered without degrading the breakdown voltage. The semiconductor device 100 can also be referred to as a "boosttransistor" because of the increased doping level in the drain extension region and the improvement of the on state resistance.

In the embodiment depicted in FIG. 1, the field plate 114 is used as an active part of the semiconductor device 100 to decrease the on-resistance of the semiconductor device. In an embodiment, the field plate 114 is used in the on state as a gate for an accumulation field effect transistor (FET) formed by the drain extension region 108, the insulation layer 110, and the field plate 114. In particular, by putting a high voltage on the field plate 114 in the on state, an accumulation layer will be formed in the drain extension region that will lower the on-resistance. In some embodiments, the voltage applied to the field plate 114 in the on state is higher than the voltage applied to the gate layer in the on state. By switching off the voltage on the field plate 114 and providing a low or zero voltage at the gate layer 112, the semiconductor device 100 goes back to the off state. In the off state, the Reduced Surface Field (RESURF) effect is enhanced by an appropriate field plate voltage. In some embodiments, a negative voltage is applied at the field plate 114 in the off state, which allows more doping to be used in the drain extension region 108 to lower the on state resistance. The voltage applied to the field plate 114 in the off state depends on the thickness of the insulation layer 110 between the field plate 114 and the drain extension region 108. The voltage applied to the field plate 114 in the off state can be, for example, up to −300 Volt/micron of insulator thickness. For example, the voltage applied to the field plate 114 in the off state can be −30V at an insulator thickness of 100 nm. By applying appropriate voltages to the field plate 114 in the on state and in the off state, the on-resistance of the semiconductor device 100 can be reduced to a desired level, regardless of whether the semiconductor device 100 is a vertical device or a lateral device.

In an exemplary operation of the semiconductor device 100, during the on state, a positive gate voltage is applied to the gate layer 112 through the voltage terminal 116 and a positive field plate voltage, which is larger than the gate voltage, is applied to the field plate 114. During the off state, the gate layer is grounded while the field plate 114 is grounded or connected to a negative voltage.

The footprint of a semiconductor device, such as, a power transistor, is in general determined by the resistance in the on state of the semiconductor device. By using the drain extension region 108 as an accumulation layer/region in the on state, the on-resistance of the semiconductor device 100 is greatly reduced. The higher the voltage applied at the field plate 114, the lower the resistance of the accumulation layer. In an embodiment, the resistance of the accumulation layer is the inverse of the voltage applied at the field plate. Because the on-resistance of the semiconductor device 100 is reduced, the semiconductor device 100 can therefore be made much smaller, compared to a conventional device with an electrically connected gate field plate layer.

Compared to a conventional device with an electrically connected gate field plate layer, the semiconductor device (boosttransistor) 100 can be implemented in circuits that require a relatively low resistance in the on state. In general, circuits that require a relatively low on resistance include circuits that handle large currents, such as, relay drivers, motor drivers or lamp drivers. These circuits primarily require a transistor circuit to exhibit a low on state resistance and don't require fast switching speeds or tight control of the output current. Because the dimensions of these transistors are relatively large, lowering the on resistance by boosting the field plate voltage will have a substantial impact on the size of the transistors. Although extra space may be needed for a drive circuit that is capable of generating multiple drive voltages, the overall space requirement for a transistor circuit will still be reduced.

The exact location of the physical separation between the gate layer 112 and the field plate 114 can be variable. In most cases, the field plate 114 is closer to the top surface 150 of the insulation layer 110 than the gate layer 112. However, in some embodiments, a part of the field plate 114 can be overlapped with the gate layer 112. In these embodiments, the voltage that can be applied to the field plate 114 is limited because of the proximity to the gate layer 112.

The gate layer 112 and the electrically insulated field plate 114 can be made from the same material or from different materials. FIGS. 2-6 depict some embodiments of the semiconductor device 100 of FIG. 1. Although some embodiments of the semiconductor device are shown and described, the implementation of the semiconductor device is not limited to the embodiments depicted.

Figure 2:
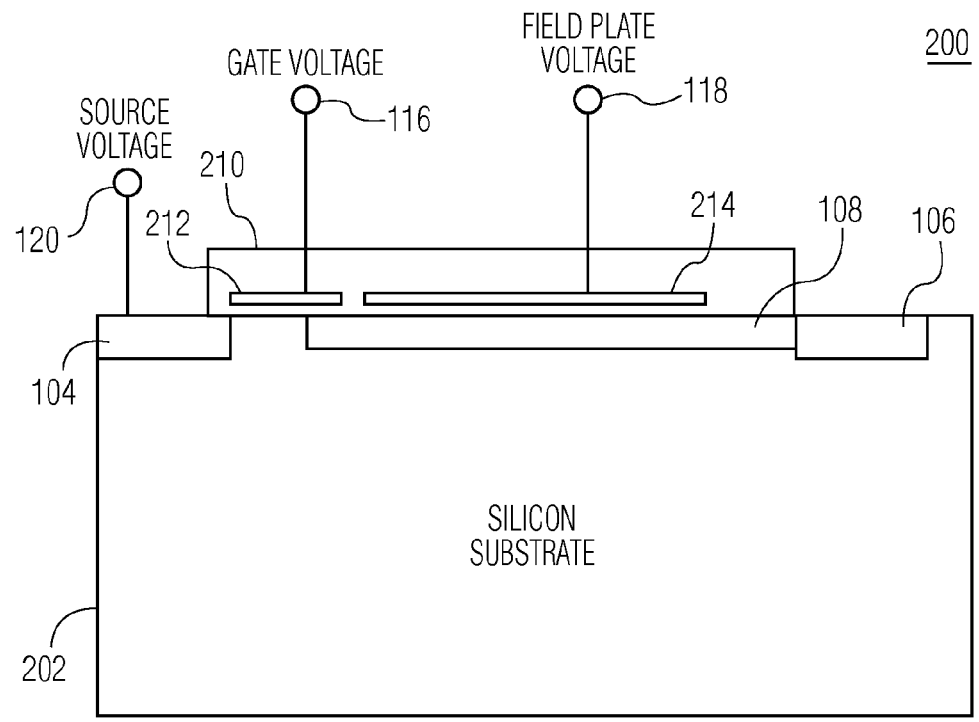
FIGS. 2-6 depict five alternative embodiments of the semiconductor device.

FIG. 2 depicts an embodiment of the semiconductor device 100 of FIG. 1 in which a gate layer 212 and a field plate 214 are made from the same material. In the embodiment depicted in FIG. 2, a transistor 200 includes a silicon substrate 202, the source region 104, the drain region 106, and the drain extension region 108 formed in the silicon substrate, and an oxide layer 210 within which the gate layer 212 and the field plate 214 are formed. The gate layer 212 is connected to a voltage terminal 116 to receive a gate voltage. The field plate 214 is connected to a voltage terminal 118 to receive a field plate voltage. The source region is connected to a voltage terminal 120 to receive a source voltage. In the embodiment depicted in FIG. 2, the gate layer 212 and the field plate 214 are made from polysilicon. In an embodiment, the gate layer 212 and the field plate 214 are electrically disconnected (e.g., electrically insulated) sections of the same polysilicon layer.

Figure 3:
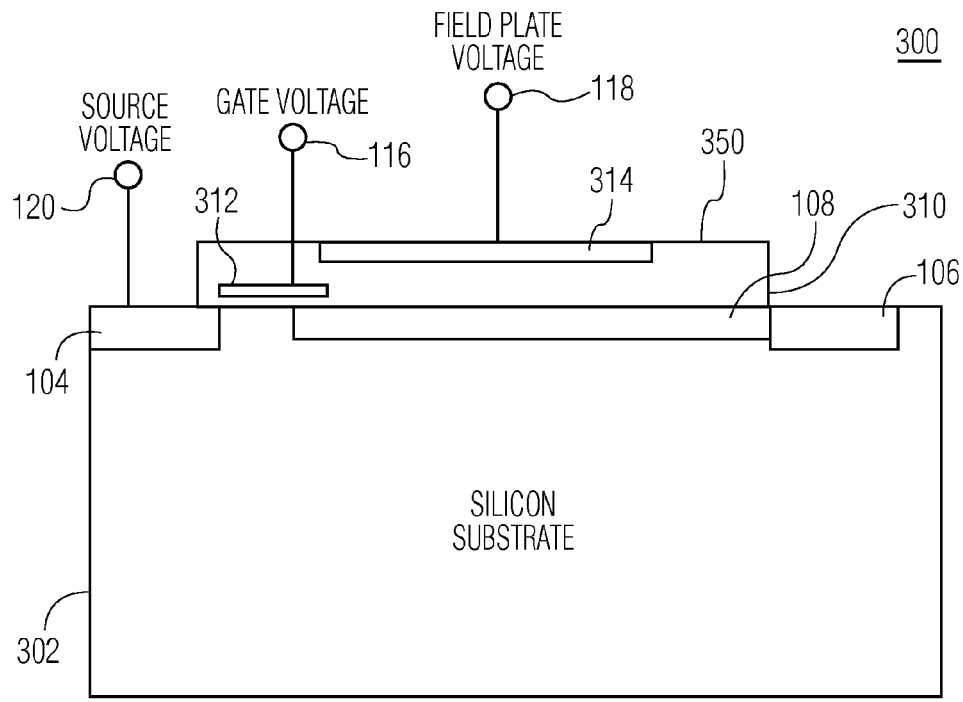

FIG. 3 depicts an embodiment of the semiconductor device 100 of FIG. 1 in which a gate layer 312 and a field plate 314 are made from different materials. In the embodiment depicted in FIG. 3, a transistor 300 includes a silicon substrate 302, the source region 104, the drain region 106, and the drain extension region 108 formed in the silicon substrate, and an oxide layer 310 within which the gate layer 312 and the field plate 314 are formed. The gate layer 312 is connected to a voltage terminal 116 to receive a gate voltage. The field plate 314 is connected to a voltage terminal 118 to receive a field plate voltage. The source region is connected to a voltage terminal 120 to receive a source voltage. The gate layer 312 is made from polysilicon while the field plate 314 is made from a metal. In the embodiment depicted in FIG. 3, the polysilicon gate layer 312 is buried (i.e., fully enclosed) in the oxide layer 310 while the metallic field plate 314 is exposed at the surface 350 of the oxide layer 310.

Figure 4:
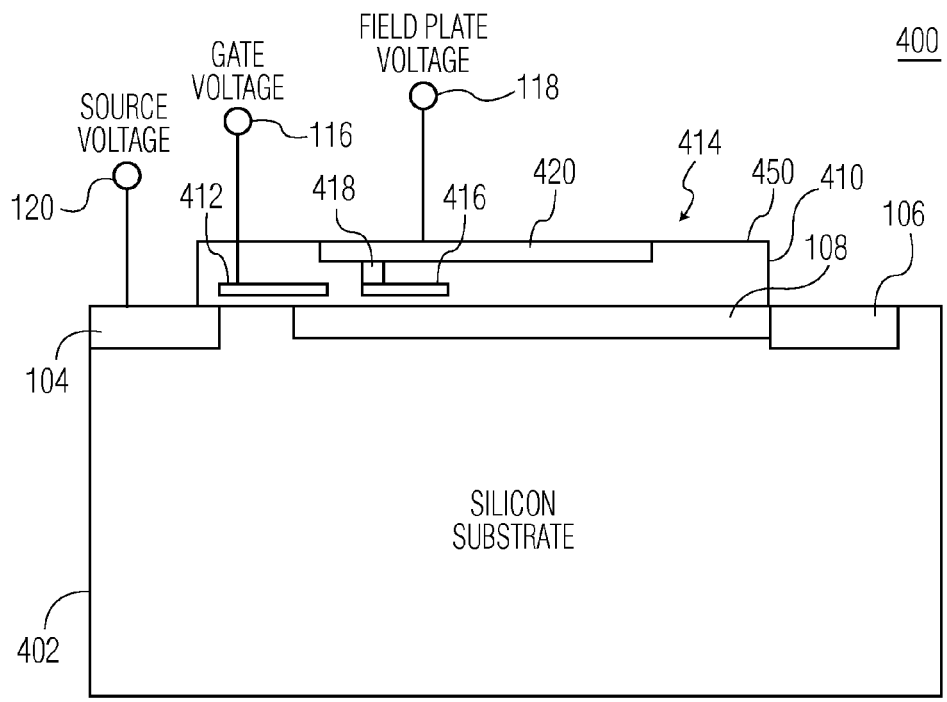

FIG. 4 depicts an embodiment of the semiconductor device 100 of FIG. 1 in which a gate layer 412 and a field plate 414 are made from a common material and from different materials. In the embodiment depicted in FIG. 4, a transistor 400 includes a silicon substrate 402, the source region 104, the drain region 106, and the drain extension region 108 formed in the silicon substrate, and an oxide layer 410 within which the gate layer 412 and the field plate 414 are formed. The gate layer 412 is made from polysilicon. The field plate 414 includes a polysilicon layer 416, a via 418, and a metal layer 420. The polysilicon gate layer 412 is connected to a voltage terminal 116 to receive a gate voltage. The source region is connected to a voltage terminal 120 to receive a source voltage. The metal layer 420 is connected to a voltage terminal 118 to receive a field plate voltage. In the embodiment depicted in FIG. 4, the polysilicon gate layer 412 is fully embedded in the oxide layer 410 while the metal layer 420 of the field plate 414 is exposed at the surface 450 of the oxide layer 410. The transistor 400 creates a smooth transition from the gate layer 412 to the region covered by the field plate 414 by overlapping the opening between the polysilicon gate layer 412 and the polysilicon layer 416 with the metal layer 420. The thick insulating layer between the metal layer 420 and the drain extension avoids field peaks at field plate edges, which allows the transistor 400 to be used in devices with high breakdown voltages.

Figure 5:
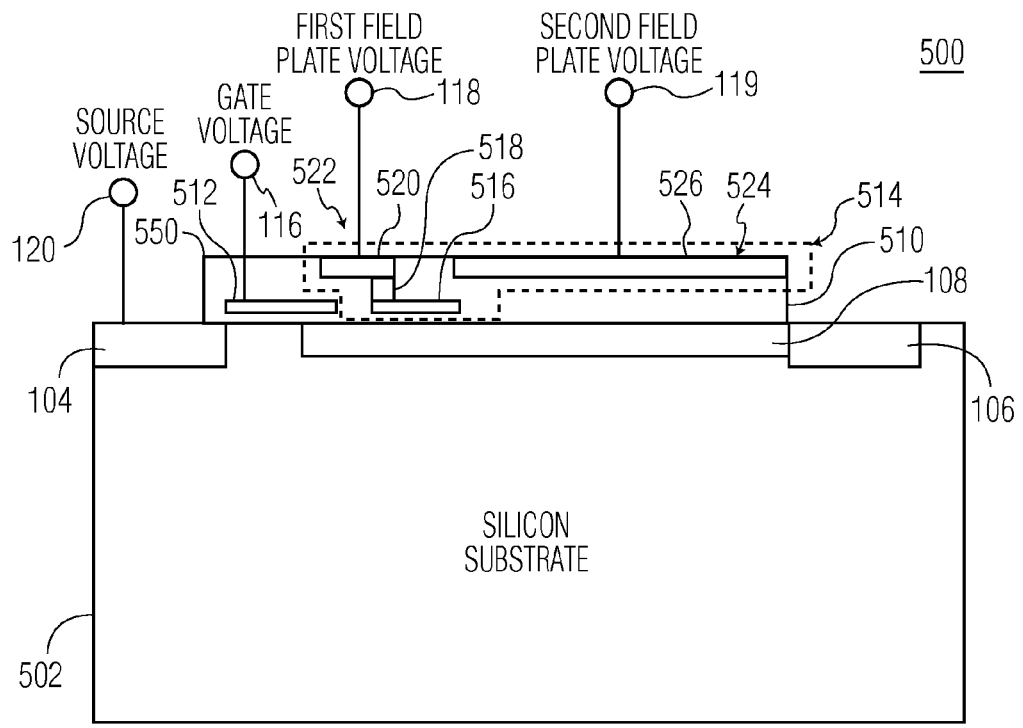

FIG. 5 depicts an embodiment of the semiconductor device 100 of FIG. 1 in which a field plate 514 includes separated field plate sections. In the embodiment depicted in FIG. 5, a transistor 500 includes a silicon substrate 502, the source region 104, the drain region 106, and the drain extension region 108 formed in the silicon substrate, and an oxide layer 510 within which a gate layer 512 and the field plate 514 are formed. The source region is connected to a voltage terminal 120 to receive a source voltage. The gate layer 512 is made from polysilicon. The field plate 514 includes a first field plate section 522, which includes a polysilicon layer 516, a via 518, and a first metal layer 520 (similar to the field plate 414 of FIG. 4), which is connected to a voltage terminal 118 to receive a first field plate voltage, for example, from a voltage driver circuit, and a second field plate section 524, which includes a second metal layer 526, which is connected to a voltage terminal 119 to receive a second field plate voltage. The polysilicon gate layer 512 is connected to a voltage terminal 116 to receive a gate voltage. In the embodiment depicted in FIG. 5, the polysilicon gate layer 512 and the polysilicon layer 518 of the field plate 514 are fully embedded in the oxide layer 510 while the metal layers 520, 526 of the field plate 514 are exposed at the surface 550 of the oxide layer 510. In FIG. 5, the feature of overlapping the opening between the gate layer 512 and the field plate 514 is combined with the thicker insulation layer, which allows different voltages to be applied to the metallic field plate 514 via the terminals 118, 119.

Figure 6:
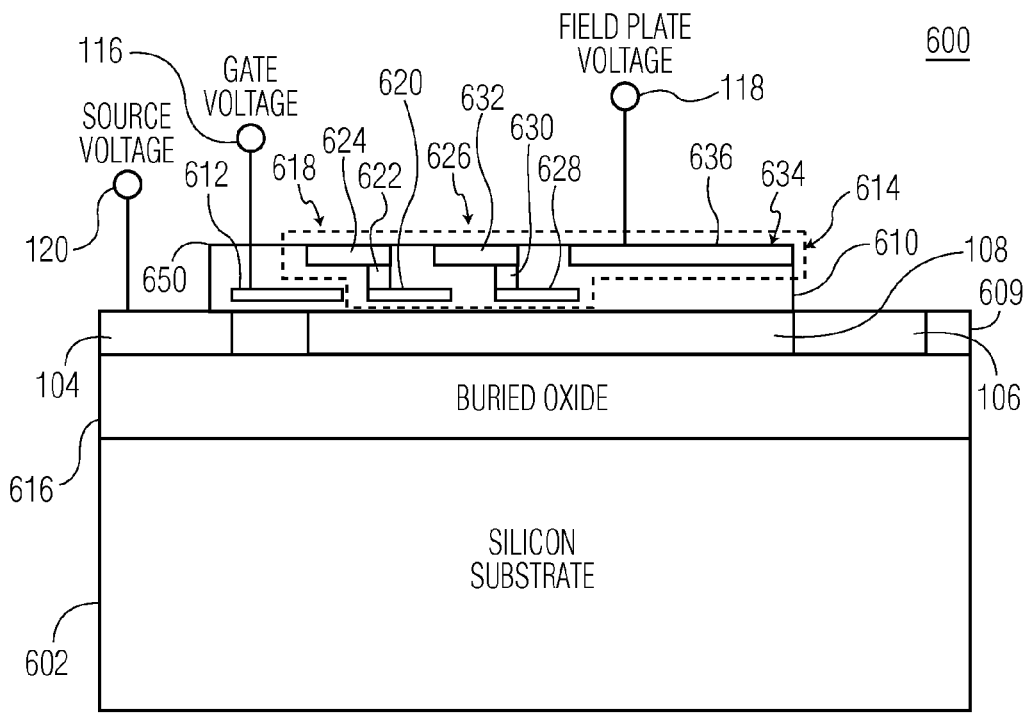

FIG. 6 depicts an embodiment of the semiconductor device 100 of FIG. 1 that uses silicon on insulator (SOI) technology. In the embodiment depicted in FIG. 6, a transistor 600 includes a silicon substrate 602, the source region 104, the drain region 106, the drain extension region 108, and a buried oxide layer 616 formed in or on the silicon substrate. The source region 104, the drain region 106, and the drain extension region 108 are contained in a SOI layer 609. The source region is connected to a voltage terminal 120 to receive a source voltage. The transistor 600 also includes an oxide layer 610 within which a gate layer 612 and a field plate 614 are formed. The gate layer 612 is made from polysilicon. The field plate 614 includes a first field plate section 618, which includes a first polysilicon layer 620, a first via 622, and a first metal layer 624 (similar to FIG. 4), a second field plate section 626, which includes a second polysilicon layer 628, a second via 630, and a second metal layer 632 (similar to FIG. 4), and a third field plate section 634, which includes a third metal layer 636 (similar to FIG. 5). The polysilicon gate layer 512 is connected to a voltage terminal 116 to receive a gate voltage. The metal layer 636 of the third field plate section 634 is connected to a voltage terminal 118 to receive a field plate voltage. In some embodiments, the transistor 600 includes separate voltage terminals that are connected to the metal layer 624 of the first field plate section 618 and the metal layer 632 of the second field plate section 626. In the embodiment depicted in FIG. 6, the polysilicon gate layer 612 and the polysilicon layers 620, 628 are fully enclosed in the oxide layer 610 while the metal layers 624, 632, 636 of the field plate 614 are exposed at the surface 650 of the oxide layer 610. In FIG. 6, the feature of the field plate voltage steering is combined with the SOI technology in which a voltage can be applied to the substrate. Although FIG. 6 shows a transistor 600 that has the oxide layer 610 on top of the silicon substrate, in some embodiments, the oxide layer 610 may be located at the bottom of the silicon substrate. In addition, the transistor 600 may be a trench FET or a fin FET in which the oxide layer 610 is located aside the silicon substrate.

Figure 7:
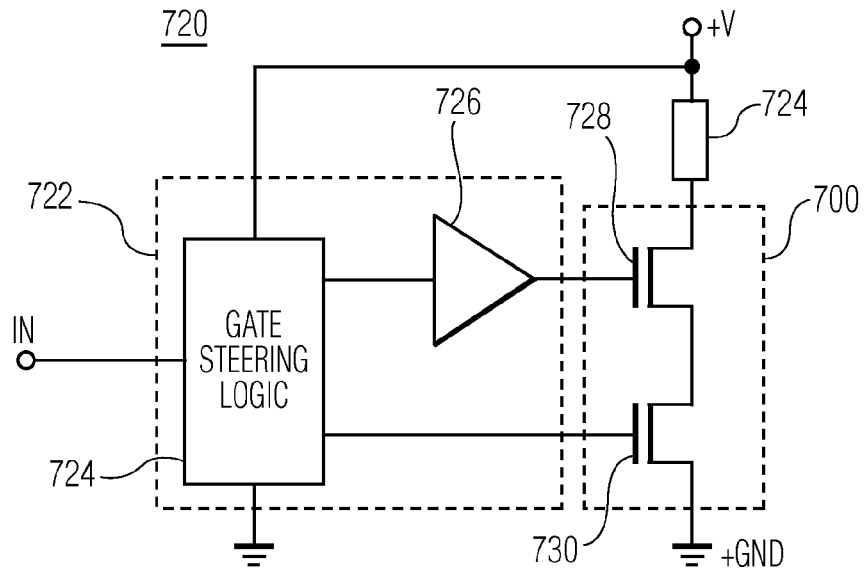
FIG. 7 is a block diagram of an application circuit that includes the semiconductor device of FIG. 1 and a driver circuit.

Compared to a conventional device with an electrically connected gate layer/field plate, the semiconductor device 100 can be implemented in a smaller space at the expense of a more complicated driver circuit that can provide multiple drive voltages to the semiconductor device 100. FIG. 7 is a block diagram of a circuit 720 that includes a driver circuit 722 and a semiconductor device 700. In the embodiment depicted in FIG. 7, the circuit 720 includes the driver circuit, the semiconductor device 700, and a resistor 724. The driver circuit includes a gate steering logic circuit 724 and an optional amplifier 726. The semiconductor device 700 may be similar to or the same as any one of the semiconductor devices 100, 200, 300, 400, 500, 600. In the embodiment depicted in FIG. 7, the semiconductor device 700 includes a field plate transistor 728, which corresponds to an accumulation FET formed by the drain extension region 108, the insulation layer 110 and the field plate 114, and a channel/gate transistor 730, that corresponds to the gate layer 112. Although some of the space saved by the semiconductor device 700 is needed for the gate steering logic circuit and the optional amplifier to steer the field plate 114 and the gate layer 112, the overall footprint of the circuit 700 is still reduced. The driver circuit can be implemented in the same IC chip as the semiconductor device 700 to save IC space or implemented in a separate IC chip from the semiconductor device 700, e.g., for safety reasons.

Figure 8:
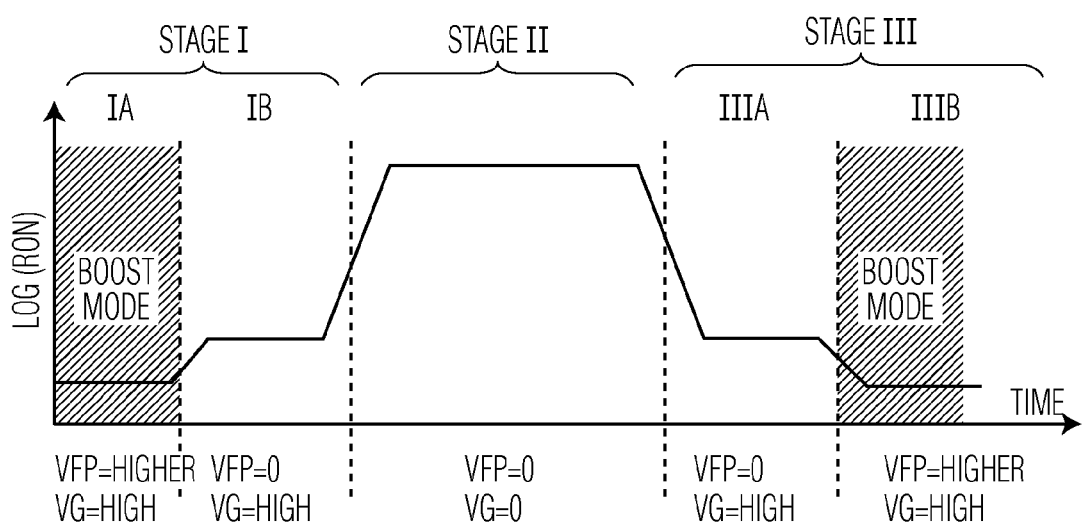
FIG. 8 illustrates the resistance of the semiconductor device of FIG. 1 during an operation cycle.

FIG. 8 illustrates the resistance of the semiconductor device 100 of FIG. 1 during an on-off-on cycle of the device. The vertical axis in FIG. 8 represents the on-resistance of the semiconductor device 100. The horizontal axis in FIG. 8 represents time, which is divided into stages I, II, and III. Stage I includes two sub-stages IA and IB. In sub-stage IA, the semiconductor device 100 is in a boost mode. In particular, the voltage applied to the field plate 114, "VFP," is higher than the voltage applied to the gate layer 112, "VG," and consequently, the resistance of the semiconductor device 100 is kept low. In sub-stage IB, the voltage applied to the field plate 114 is set to zero and the resistance of the semiconductor device 100 increases. In stage II, the semiconductor device 100 is turned off and the voltages applied to the gate layer 112 and to the field plate 114 are set to zero. Consequently, the resistance of the semiconductor device 100 increases. In some embodiments, the voltage at the field plate 114 is set to negative in stage II. Stage III includes two sub-stages IIIA and IIIB. In sub-stage IIIA, the voltage applied to the field plate 114 is set to zero and the resistance of the semiconductor device 100 is still high. In some embodiments, the voltage at the field plate 114 is made negative in the sub-stages IB and IIIA. In sub-stage IIIB, the semiconductor device 100 is in a boost mode. In particular, the voltage applied to the field plate 114 is higher than the voltage applied to the gate layer 112, and consequently, the resistance of the semiconductor device 100 is kept low. As shown in FIG. 8, when the semiconductor device 100 operates under the boost mode, in which the voltage applied to the field plate 114 is higher than the voltage applied to the gate layer 112, the resistance of the semiconductor device 100 is kept low.

Figure 9:
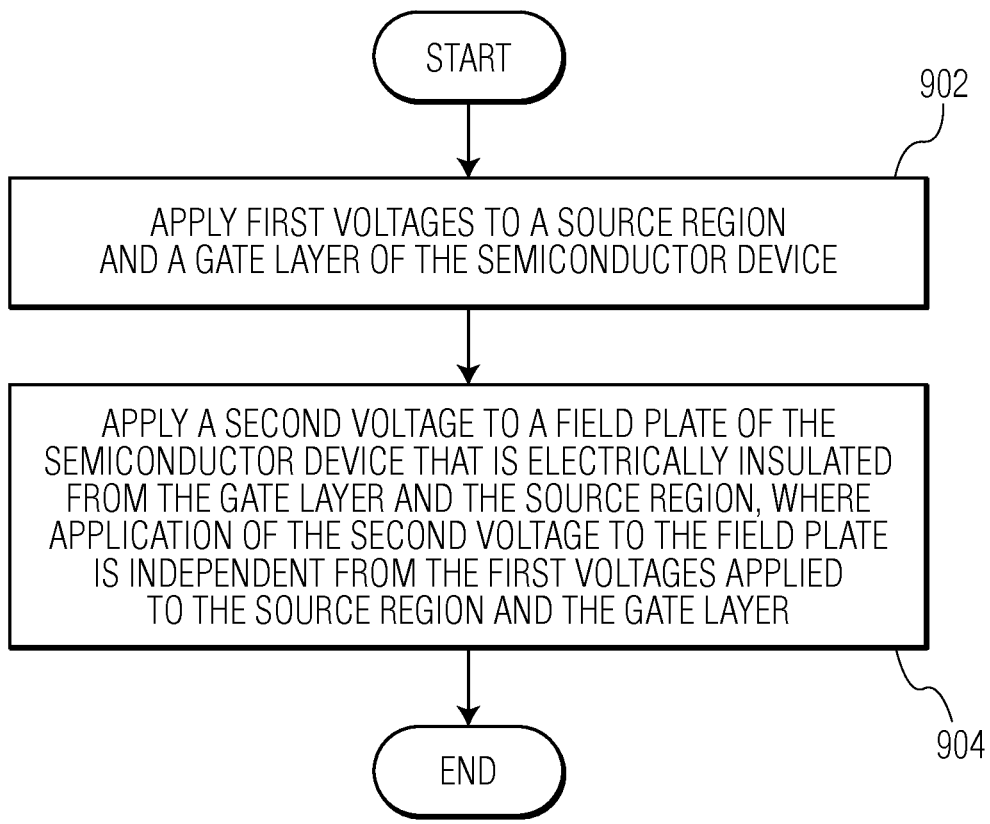
FIG. 9 is a process flow diagram of a method for operating a semiconductor device in accordance with an embodiment of the invention.

FIG. 9 is a process flow diagram of a method for operating a semiconductor device in accordance with an embodiment of the invention. The semiconductor device may be similar to or the same as any one of the semiconductor devices 100, 200, 300, 400, 500, 600. At block 902, first voltages are applied to a source region and a gate layer of the semiconductor device. At block 904, a second voltage is applied to a field plate of the semiconductor device that is electrically insulated from the gate layer and the source region. Application of the second voltage to the field plate is independent from the first voltages applied to the source region and the gate layer.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A semiconductor device comprising:
    a substrate;
    a source region, a drain region, and a drain extension region formed in the substrate; and
    an insulation layer adjacent to the drain extension region, wherein a gate layer and a field plate are formed within the insulation layer, the field plate includes a polysilicon layer, a via, and a metal layer, wherein the field plate is located adjacent to the drain extension region and is electrically insulated from the gate layer and the source region such that a voltage can be applied to the field plate independent from voltages applied to the gate layer and the source region, wherein the field plate includes a polysilicon layer enclosed in the insulation layer, a metal layer exposed at the surface of the insulation layer, and a via connecting the polysilicon layer and the metal layer and enclosed in the insulation layer.

2. The semiconductor device of claim 1, wherein the field plate is electrically insulated from the gate layer such that a voltage can be applied to the field plate without affecting the voltage applied to the gate layer.

3. The semiconductor device of claim 2, wherein the gate layer and the field plate are made of the same material.

4. The semiconductor device of claim 3, wherein the gate layer and the field plate are made of polysilicon.

5. The semiconductor device of claim 2, wherein the gate layer and the field plate are made of different materials.

6. The semiconductor device of claim 1, wherein the gate layer is fully enclosed in the insulation layer.

7. The semiconductor device of claim 1, wherein the insulation layer comprises a first oxide layer, and wherein the substrate comprises a second oxide layer.

8. The semiconductor device of claim 1, further comprising:
    a first voltage terminal connected to the gate layer through the insulation layer and configured to receive a gate voltage; and
    a second voltage terminal connected to the field plate and configured to receive a field plate voltage, wherein the field plate voltage is higher than the gate voltage during an on state of the semiconductor device.

9. The semiconductor device of claim 8, wherein the field plate voltage is not positive during an off state of the semiconductor device.

10. The semiconductor device of claim 1, wherein the drain extension region is extended in a direction from the drain region to the source region.

11. The semiconductor device of claim 1, wherein the semiconductor device is a transistor.

12. A circuit comprising:
    a semiconductor device comprising:
        a substrate;
        a source region, a drain region, and a drain extension region formed in the substrate; and
        an insulation layer adjacent to the drain extension region, wherein a gate layer and a field plate are formed within the insulation layer, the field plate includes a polysilicon layer, a via, and a metal layer, wherein the field plate extends over the drain extension region and is electrically insulated from the gate layer and the source region such that a voltage can be applied to the field plate independent from voltages applied to the gate layer and the source region, wherein the field plate includes a polysilicon layer enclosed in the insulation layer, a metal layer exposed at the surface of the insulation layer, and a via connecting the polysilicon layer and the metal layer and enclosed in the insulation layer; and
    a driver circuit configured to provide a first voltage to the gate layer and a second voltage to the field plate.

13. The circuit of claim 12, wherein the driver circuit is further configured to:
    set the second voltage to be higher than the first voltage during an on state of the semiconductor device; and
    set the second voltage to one of zero and negative during an off state of the semiconductor device.

* * * * *